US009490242B2

(12) United States Patent
Yoshimochi

(10) Patent No.: US 9,490,242 B2
(45) Date of Patent: *Nov. 8, 2016

(54) SEMICONDUCTOR DEVICE AND SEMICONDUCTOR PACKAGE

(71) Applicant: ROHM CO., LTD., Kyoto (JP)

(72) Inventor: Kenichi Yoshimochi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/838,360

(22) Filed: Aug. 27, 2015

(65) Prior Publication Data

US 2015/0371983 A1    Dec. 24, 2015

Related U.S. Application Data

(63) Continuation of application No. 14/078,795, filed on Nov. 13, 2013, now Pat. No. 9,123,535, which is a continuation of application No. 13/316,429, filed on Dec. 9, 2011, now Pat. No. 8,610,213.

(30) Foreign Application Priority Data

Dec. 10, 2010   (JP) ................................ 2010-276127

(51) Int. Cl.
*H01L 27/02*   (2006.01)
*H01L 23/495*  (2006.01)
(Continued)

(52) U.S. Cl.
CPC ......... *H01L 27/0255* (2013.01); *H01L 23/293* (2013.01); *H01L 23/3107* (2013.01); *H01L 23/49562* (2013.01); *H01L 27/0629* (2013.01); *H01L 27/0727* (2013.01);
(Continued)

(58) Field of Classification Search
CPC .......... H01L 29/7813; H01L 29/7802; H01L 29/1095; H01L 29/0696; H01L 29/0634
USPC ................................................... 257/328, 378
See application file for complete search history.

(56) References Cited

U.S. PATENT DOCUMENTS 6,495,888 B1   12/2002  Yamato
7,838,907 B2   11/2010  Shiraishi
(Continued)

FOREIGN PATENT DOCUMENTS

CN         1547765 A      11/2004
CN       101233616 A       7/2008
(Continued)

OTHER PUBLICATIONS

Chinese Office Action with excerpt translation dated Aug. 20, 2015.

*Primary Examiner* — Quoc Hoang
(74) *Attorney, Agent, or Firm* — Rabin & Berdo, P.C.

(57) ABSTRACT

A semiconductor device capable of ensuring a withstand voltage of a transistor and reducing a forward voltage of a Schottky barrier diode in a package with the transistor and the Schottky barrier diode formed on chip, and a semiconductor package formed by a resin package covering the semiconductor device are provided. The semiconductor device 1 includes a semiconductor layer 22, a transistor area D formed on the semiconductor layer 22 and constituting the transistor 11, and a diode area C formed on the semiconductor layer 22 and constituting the Schottky barrier diode 10. The semiconductor layer 22 in the diode area C is thinner than the semiconductor layer 22 in the transistor area D.

18 Claims, 13 Drawing Sheets

(51) Int. Cl.

| | |
|---|---|
| *H01L 27/06* | (2006.01) |
| *H01L 29/06* | (2006.01) |
| *H01L 29/66* | (2006.01) |
| *H01L 29/78* | (2006.01) |
| *H01L 23/31* | (2006.01) |
| *H01L 27/07* | (2006.01) |
| *H01L 23/29* | (2006.01) |
| *H01L 29/423* | (2006.01) |
| *H01L 29/417* | (2006.01) |
| *H01L 29/45* | (2006.01) |
| *H01L 29/47* | (2006.01) |
| *H01L 29/872* | (2006.01) |
| *H01L 23/00* | (2006.01) |

(52) U.S. Cl.
CPC ...... *H01L 29/0657* (2013.01); *H01L 29/4236* (2013.01); *H01L 29/66727* (2013.01); *H01L 29/66734* (2013.01); *H01L 29/7806* (2013.01); *H01L 29/7813* (2013.01); *H01L 24/48* (2013.01); *H01L 24/49* (2013.01); *H01L 29/41766* (2013.01); *H01L 29/456* (2013.01); *H01L 29/47* (2013.01); *H01L 29/872* (2013.01); *H01L 2224/48091* (2013.01); *H01L 2224/48247* (2013.01); *H01L 2224/48465* (2013.01); *H01L 2224/49175* (2013.01); *H01L 2924/01019* (2013.01); *H01L 2924/12032* (2013.01); *H01L 2924/13091* (2013.01)

(56) References Cited

U.S. PATENT DOCUMENTS

| | | |
|---|---|---|
| 8,610,213 B2 | 12/2013 | Kenichi |
| 9,123,535 B2 * | 9/2015 | Yoshimochi ...... H01L 23/49562 |
| 2004/0021174 A1 | 2/2004 | Kobayashi |
| 2005/0258479 A1 | 11/2005 | Ono et al. |
| 2009/0057757 A1 | 3/2009 | Hokomoto et al. |

FOREIGN PATENT DOCUMENTS

| | | |
|---|---|---|
| CN | 101889334 A | 11/2010 |
| JP | 2002-373989 A | 12/2002 |
| JP | 2003-318396 A | 11/2003 |
| JP | 2005-354037 A | 12/2005 |
| JP | 2009-059860 A | 3/2009 |
| JP | 2009-253139 A | 10/2009 |
| JP | 2010-114248 A | 5/2010 |
| WO | WO-03019623 A2 | 3/2003 |

* cited by examiner

SEMICONDUCTOR DEVICE AND SEMICONDUCTOR PACKAGE

This is a Continuation of U.S. application Ser. No. 14/078,795, filed on Nov. 13, 2013, and allowed on Apr. 29, 2015, which was a continuation of U.S. application Ser. No. 13/316,429, filed on Dec. 9, 2011, allowed on Aug. 15, 2013, and issued on Dec. 17, 2013 as U.S. Pat. No. 8,610,213. These prior US applications and the present continuation application claim the benefit of priority of Japanese application 2010-276127 filed on Dec. 10, 2010. The disclosures of these prior US and foreign applications are incorporated herein by reference.

BACKGROUND OF THE INVENTION

1. Field of the Invention

The present invention relates to a semiconductor device and a semiconductor package formed by a resin package covering the semiconductor device.

2. Description of the Related Art

The semiconductor device disclosed in Patent Document 1 contains a Schottky barrier diode connected between a source and a drain. In particular, a p-type base layer is formed on a surface portion of an n-type semiconductor layer stacked on an n-type semiconductor substrate of the semiconductor device. A trench is dug from the surface of the n-type semiconductor layer and penetrates through the p-type base layer, and a gate insulating film is formed on the sidewall and the bottom of the trench. A gate electrode is embedded in the trench. An n-type diffusion layer is formed on the surface portion of the p-type base layer.

A trench gate-type transistor is thereby formed in the semiconductor device. In the transistor, the n-type diffusion layer is a source area, and the n-type semiconductor layer is a drain area. A channel is formed near an interface of the p-type base layer and the gate insulating film between the n-type diffusion layer and the n-type semiconductor layer, so that a current passes between the source area and the drain.

A metal layer is stacked on the surface of the n-type semiconductor layer. The metal layer exerts the function of source electrode by means of contacting the n-type diffusion layer and forming the Schottky bonding between the area and the metal layer by means of contacting the area outside the p-type base layer and the surface of the n-type semiconductor layer. In this manner, the transistor and the Schottky barrier diode are formed on one chip in the semiconductor device.

Patent Document 1: Japanese Laid-open Patent Publication No. 2009-59860

SUMMARY OF THE INVENTION

To ensure a (certain) withstand voltage of a transistor, the thickness of an n-type semiconductor layer is required to be greater than a necessary thickness. In the semiconductor device of Patent Document 1, the thickness of the n-type semiconductor layer in the area where the transistor is formed is the same as the area where a Schottky barrier diode is formed. Therefore, although the withstand voltage of the transistor is guaranteed, the thickness of the n-type semiconductor layer in the Schottky barrier diode area is required to be higher than a necessary thickness, so the DC resistance of the Schottky barrier diode increases. Therefore, a forward voltage (VF) of a Schottky barrier diode is difficult to reduce.

Therefore, the present invention is directed to providing a semiconductor device capable of ensuring a withstand voltage of a transistor and reducing a forward voltage of a Schottky barrier diode in a package with the transistor and the Schottky barrier diode formed on a chip, and a semiconductor package formed by a resin package covering the semiconductor device.

The semiconductor device of the present invention includes a semiconductor layer, a transistor area formed on the semiconductor layer to constitute the transistor, and a diode area formed on the semiconductor layer to constitute the Schottky barrier diode. The semiconductor layer in the diode area is thinner than the semiconductor layer in the transistor area (technical solution 1).

In the transistor area, the thickness of the semiconductor layer is designed to be a thickness necessary to ensure the withstand voltage of the transistor. On the other hand, the thickness of the semiconductor layer in the diode area is set to be a minimum necessary level. A DC resistance of the Schottky barrier diode may be reduced this way, thereby reducing the forward voltage. That is to say, the thickness of the semiconductor layer in the transistor area and the diode area are each optimized. Therefore, the transistor and the Schottky barrier diode formed on the chip ensure the withstand voltage of the transistor is ensured and reduce the forward voltage of the Schottky barrier diode.

Preferably, the semiconductor layer in the diode area is 1 μm or more thinner than the semiconductor layer in the transistor area (technical solution 2).

Preferably, the thickness of the semiconductor layer in the diode area is 2.5 μm or more (technical solution 3).

According to the present composition, a minimum level withstand voltage of the Schottky barrier diode can be ensured.

Preferably, when the transistor is a trench-type transistor having a first trench dug from a surface of the semiconductor layer in the transistor area, the bottom of the first trench and the surface of the semiconductor layer in the diode area are located at the same position in a thickness direction of the semiconductor layer (technical solution 4).

According to the present composition, the steps of forming the first trench and polishing the semiconductor layer in the diode area from the surface side to make the semiconductor layer thinner may be carried out in one step. Reducing the number of steps lowers the cost of fabricating the semiconductor device. In this manner, an inexpensive high-performance semiconductor device can be provided.

However, in the thickness direction of the semiconductor layer, as compared with the surface of the semiconductor layer in the diode area, the bottom of the first trench may also be located at a position further away from a back surface of the semiconductor layer (technical solution 5), and may also be located at a position closer to the back surface of the semiconductor layer (technical solution 6).

Preferably, the depth of the first trench is 1 μm or more (technical solution 7).

Preferably, a $SiO_2$-containing gate insulating film is formed on an inner surface of the first trench (technical solution 8). Preferably, a polysilicon-containing gate electrode is embedded on an inner side of the gate insulating film of the first trench (technical solution 9).

Preferably, when the transistor includes a main area, a drain area and a source area, a second trench in contact with the source area is formed on the semiconductor layer. The second trench is dug from a surface of the semiconductor layer in the transistor area and the surface of the semiconductor layer in the diode area is located at a position deeper than the bottom of the second trench (technical solution 10).

Preferably, the first trench and the second trench are alternately configured as shown in vertical view along the thickness direction of the semiconductor layer (technical solution 11). In this situation, the first trench and the second trench may be stripe-shaped (technical solution 12), or the first trench may be mesh-shaped as a mesh-shaped area on which the second trench is configured on an inner side thereof (technical solution 13).

The transistor may also be a planar transistor (technical solution 14).

Preferably, the transistor area surrounds the diode area as shown in vertical view along the thickness direction of the semiconductor layer (technical solution 15).

When the transistor of the transistor area is ON, the Schottky barrier diode of the diode area is OFF, thereby realizing heat dissipation of the semiconductor layer by using the diode area. When the transistor is OFF, heat dissipation of the semiconductor layer may be realized by using the transistor area. The above manner may prevent the temperature of the semiconductor device from rising. In particular, the transistor area is configured to surround the diode area, so as to dissipate the heat of one area by means of another area, thereby effectively preventing the temperature of the semiconductor device from rising. When multiple diode areas exist, the diode areas are scattered and uniformly distributed at a necessary interval, thus further effectively preventing the temperature of the semiconductor device from rising.

Preferably, the semiconductor device further includes a metal film. The metal film is electrically connected with the transistor and Schottky bonded with the semiconductor layer in the diode area (technical solution 16). In this situation, the metal film preferably contains Ti, Mo, Pd or TiN (technical solution 17).

Preferably, the semiconductor layer is epitaxially grown on a surface of a semiconductor substrate (technical solution 18).

Preferably, the semiconductor device further includes a back surface electrode. The back surface electrode is in ohmic contact with a back surface of the semiconductor substrate (technical solution 19).

The semiconductor package of the present invention includes the semiconductor device and a resin package covering the semiconductor device (technical solution 20).

BRIEF DESCRIPTION OF THE DRAWINGS

The invention will be described according to the appended drawings, in which.

Figure 1:
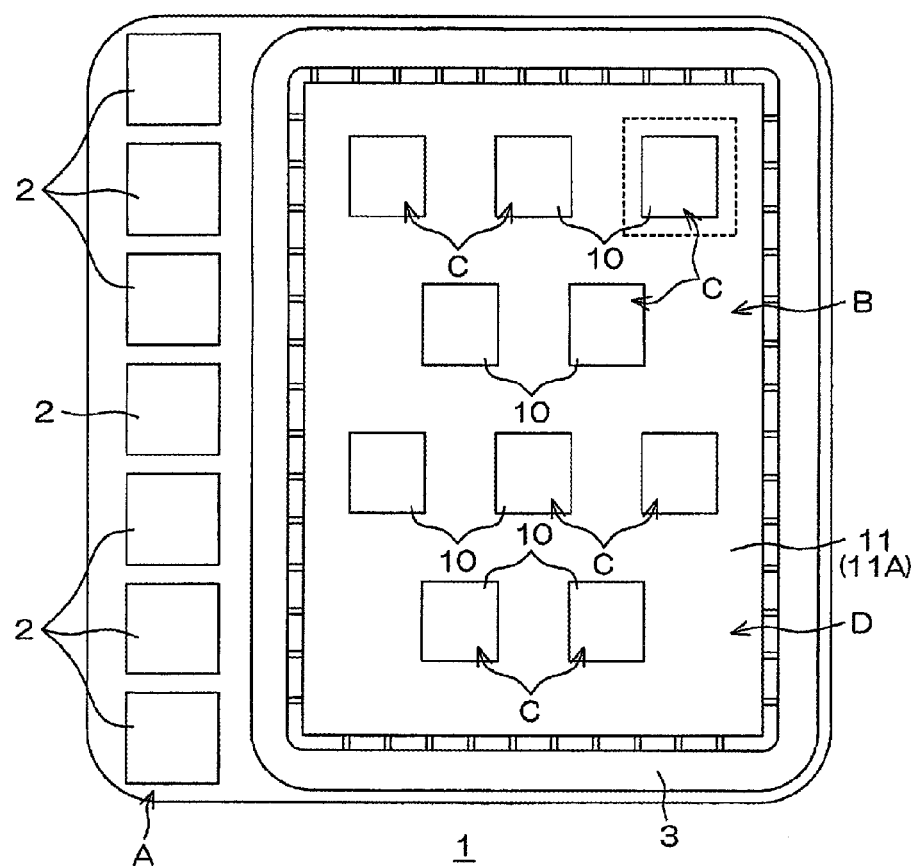
FIG. 1 is a schematic plan view of a semiconductor device according to an embodiment of the present invention.

LIST OF REFERENCE NUMERALS 1 semiconductor device
10 Schottky barrier diode
11 transistor
12 first trench
12A bottom
13 second trench
13A bottom
21 back surface electrode
22 semiconductor layer
22A surface
22B back surface
23 gate insulating film
24 gate electrode
27 first metal film
31 $p^-$-type semiconductor layer
32 $n^+$-type semiconductor layer
34 $n^-$-type semiconductor layer
41 metal film
53 metal film
60 semiconductor package
65 resin package
C diode area
D transistor area

PREFERRED EMBODIMENT OF THE PRESENT INVENTION

Hereinafter, the embodiments of the present invention will be illustrated in detail with reference to the drawings.

Figure 2:
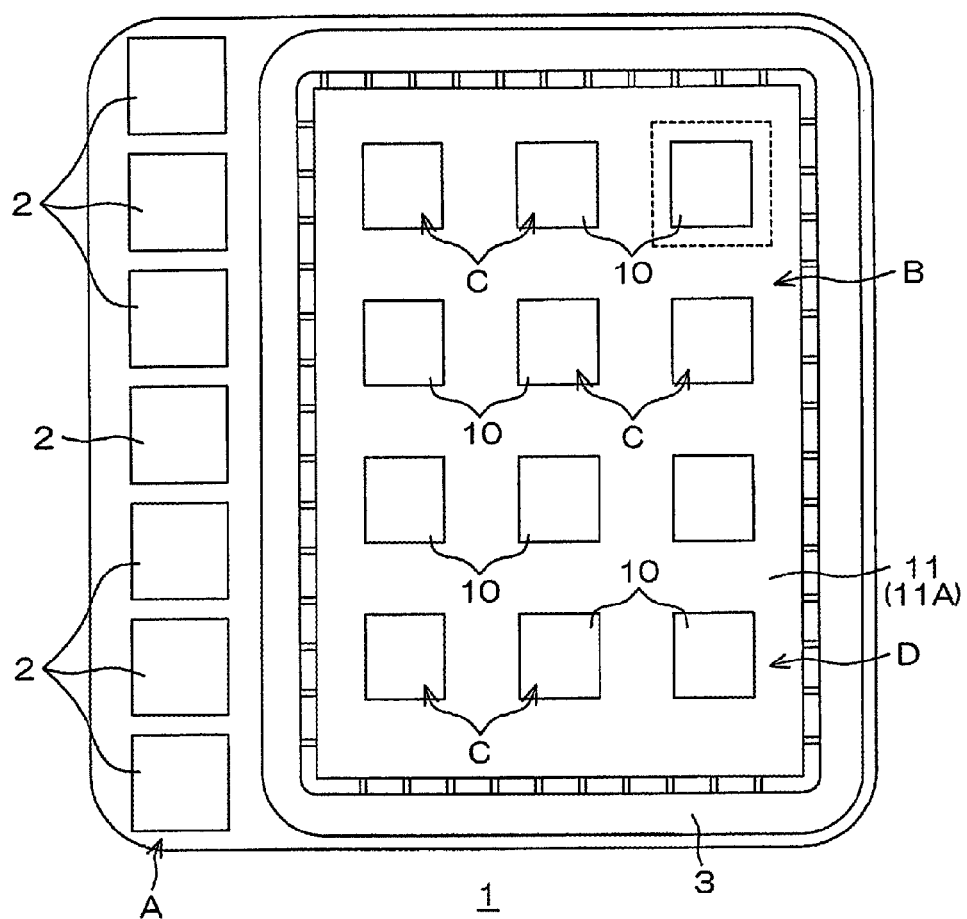
FIG. 2 is a schematic plan view of a semiconductor device according to another embodiment of the present invention.

FIG. 1 is a schematic plan view of a semiconductor device according to an embodiment of the present invention. FIG. 2 is a schematic plan view of a semiconductor device according to another embodiment of the present invention.

In an embodiment of the present invention, the semiconductor device 1 is in the shape of a quadrilateral chip when observed from the top. Each of four sides of the semiconductor device 1 when observed from the top has a length for example of several millimeters.

On the quadrilateral surface of the semiconductor device 1 when observed from the top, an external connection area A is formed along one side, and a movable area B is formed in the area outside the external connection area A. The semiconductor device 1 has: a plurality of external electrodes 2 configured in the external connection area A; a retaining ring 3 surrounding the movable area B; a plurality of diode areas C configured in the movable area B; and a transistor area D in the movable area B except the diode area C.

A plurality of (7 herein) external electrodes 2 is arranged along one side of the quadrilateral. Each of the external electrodes 2 is connected to the lead (not shown) by a connecting line (not shown) (see the description that follows below). The retaining ring 3 insulates and separates the external connection area A and the movable area B.

A plurality of diode areas C is scattered (discrete-configured) uniformly in the movable area B. In particular, a plurality of diode areas C may be spaced at an interval and arranged in a zigzag shape in FIG. 1 or a matrix shape in FIG. 2.

Figure 3:
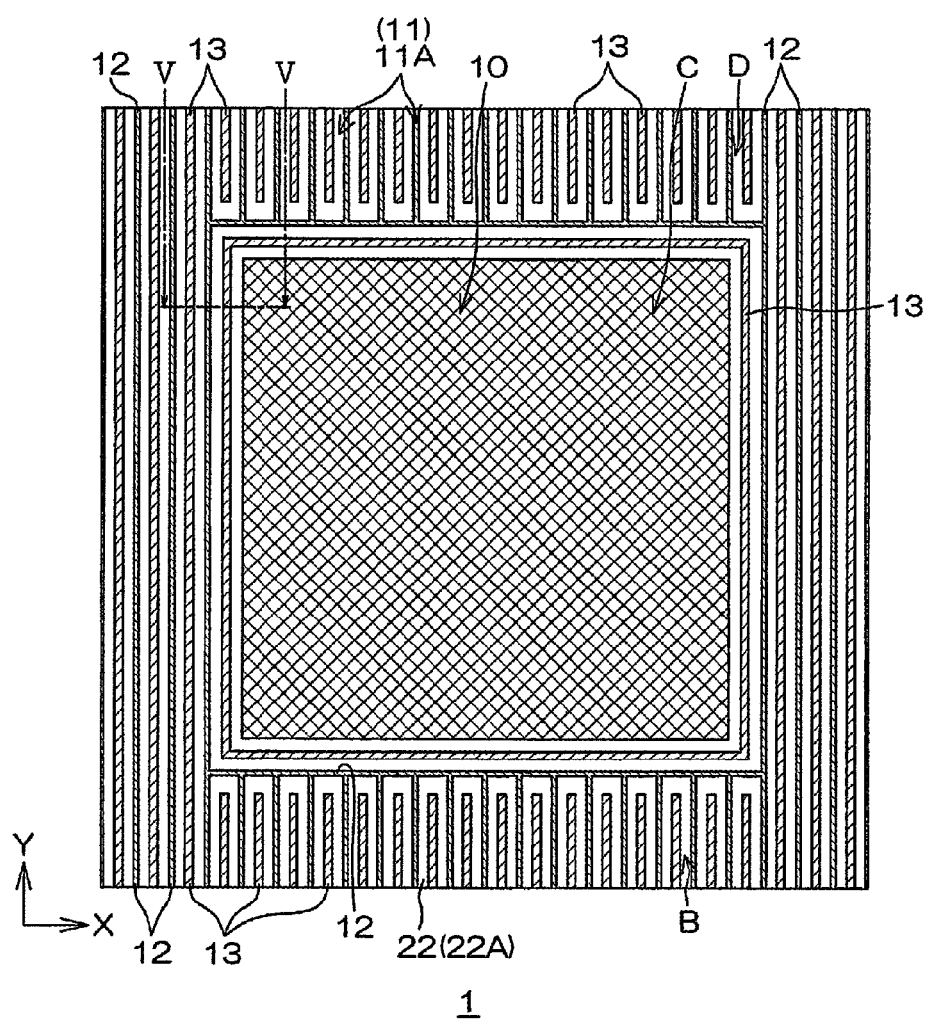
FIG. 3 is an enlarged view of the main portions of the semiconductor device in FIG. 1 or FIG. 2.
Figure 4:
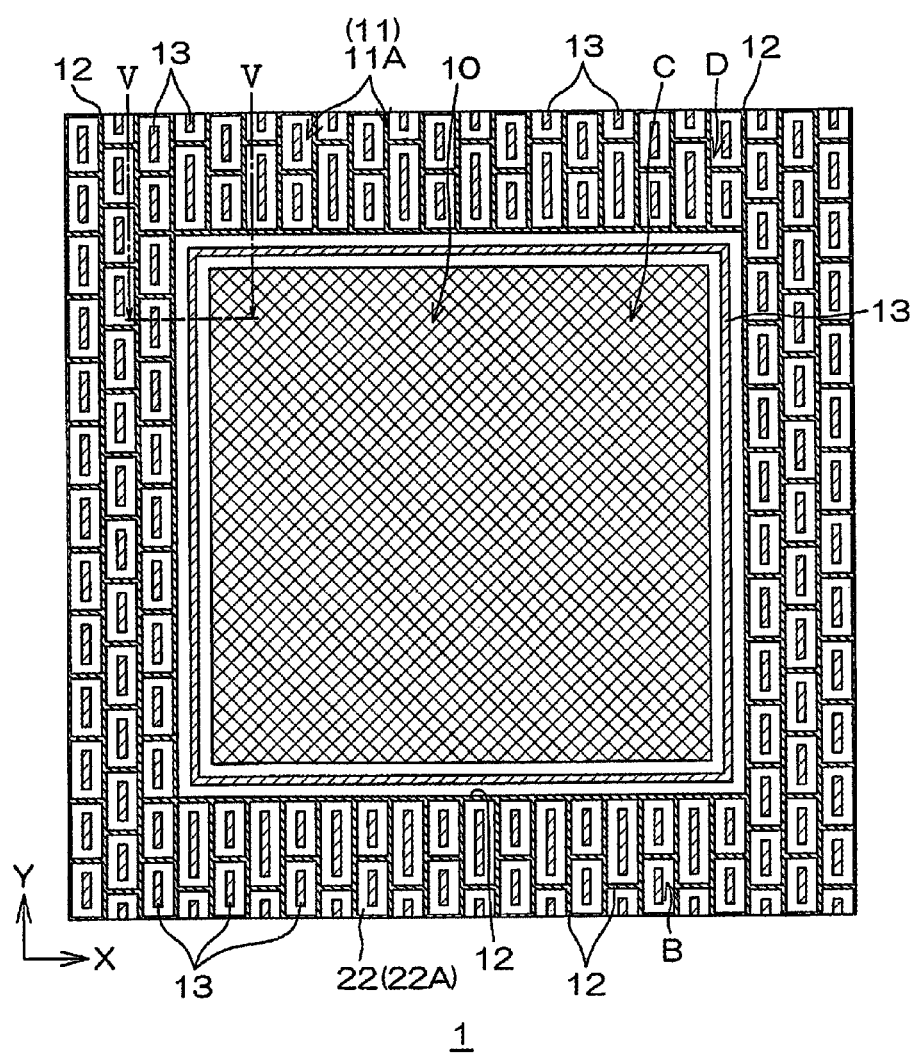
FIG. 4 is a schematic view of a variant embodiment of the main portions of the semiconductor device in FIG. 3.

FIG. 3 is an enlarged view of the main portions of the semiconductor device in FIG. 1 or FIG. 2. FIG. 4 is a schematic view of a variant embodiment of the main portions of the semiconductor device in FIG. 3.

FIG. 3 illustrates the part enclosed by dashed line in FIG. 1 or FIG. 2 (one diode area C and the surrounding transistor area D thereof).

Each diode area C is square-shaped when observed from the top. When observed from the top, each diode area C is surrounded by the transistor area D.

A Schottky barrier diode 10 is formed in the diode area C, and a plurality of transistor units 11A is formed in the transistor area D. The plurality of transistor units 11A are connected to one another to form one transistor 11 (see FIG. 1). The transistor 11 contains a plurality of Schottky barrier diodes 10 (see FIG. 1). In this manner, the transistor 11 is formed surrounding a plurality of Schottky barrier diodes 10 in the movable area B of the semiconductor device 1 (see FIG. 1).

Regarding the plurality of transistor units 11A (transistor 11), the first trench 12 and the second trench 13 are dug substantially in the overall surface area (i.e., the surface of the semiconductor layer 22) of the semiconductor device 1 of the transistor area D. The first trench 12 and the second trench 13 extend straight in the first direction Y when observed from the top, and are configured alternately at an interval in the second direction X perpendicular to the first direction Y. In other words, the first trench 12 and the second trench 13 are respectively stripe-shaped.

For the first trench 12 and the second trench 13, the second trench 13 is further formed at the position closest to the diode area C as a quadrilateral loop surrounding the entire diode area C. The first trench 12 adjacent to the second trench 13 located at the position closest to the diode area C is a quadrilateral loop surrounding the entire second trench 13.

The configuration of the first trench 12 and the second trench 13 may further refer to that shown in FIG. 4. The first trench 12 may be divided into a plurality of rectangular mesh-shaped areas by the mesh-shaped pattern. In each rectangular mesh-shaped area, the second trench 13 is spaced at an interval relative to the first trench 12 and extends straight. In this situation, the second trench 13 located at the position closest to the diode area C is a quadrilateral loop surrounding the entire diode area C, and the first trench 12 adjacent to the second trench 13 is a quadrilateral loop surrounding the entire second trench 13.

Figure 5:
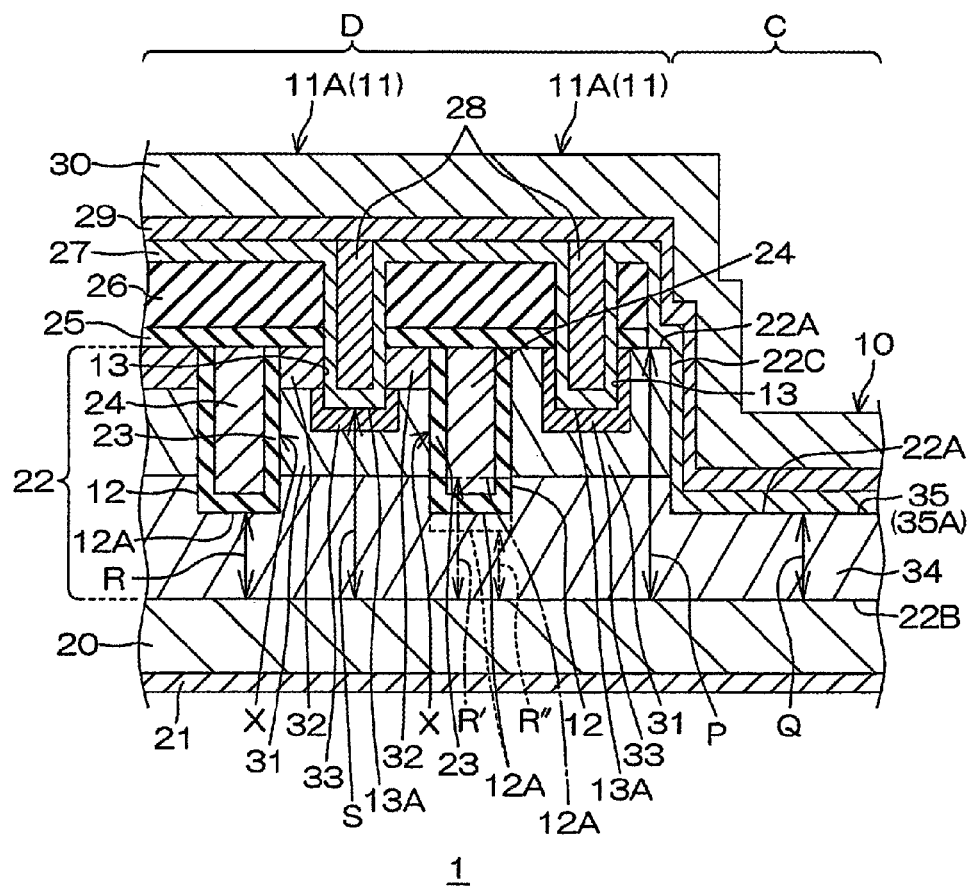
FIG. 5 is a cross-sectional view taken along a cutting line V-V in FIG. 3 or FIG. 4.

FIG. 5 is a cross-sectional view taken along a cutting line V-V in FIG. 3 or FIG. 4.

As shown in FIG. 5, the semiconductor device 1 has a semiconductor substrate 20, a back surface electrode 21, a semiconductor layer 22, a gate insulating film 23, a gate electrode 24, an oxide film 25, an insulating layer 26, a first metal film 27, a second metal film 29, a source electrode 28 and a wiring layer 30.

The semiconductor substrate 20 includes an $n^+$-type semiconductor (e.g. silicon).

The back surface electrode 21 covers the entire back surface (the lower surface in FIG. 5) of the semiconductor substrate 20. The back surface electrode 21 includes a metal (e.g. Ag, NiSi, CoSi) in ohmic contact with the n-type silicon. Therefore, the back surface electrode 21 is in ohmic contact with the back surface of the semiconductor substrate 20.

The semiconductor layer 22 is stacked on the surface (the upper surface in FIG. 5) of the semiconductor substrate 20. The semiconductor layer 22 includes an $n^-$-type semiconductor having a concentration lower than the semiconductor substrate 20. In the semiconductor layer 22 in FIG. 5, the upper surface is referred to as the surface 22A, and the lower surface is referred to as the back surface 22B. The thickness of the entire semiconductor layer 22 is, for example, 4 µm.

The semiconductor layer 22 is formed on the diode area C and the transistor area D.

FIG. 5 shows the semiconductor layer 22 around the boundary of the diode area C and the transistor area D. The semiconductor layer 22 of the diode area C is thinner than the semiconductor layer 22 in the transistor area D. Therefore, the surface 22A of the semiconductor layer 22 in the diode area C is located at a position deeper and closer to the semiconductor substrate 20 as compared with the surface 22A of the semiconductor layer 22 in the transistor area D. Therefore, the surface 22A of the semiconductor layer 22 in the diode area C is recessed towards the semiconductor substrate 20. On the other hand, the back surface 22B of the semiconductor layer 22 is flat and covers the entire area of the diode area C and the transistor area D, and extends parallel to the surface 22A of the semiconductor layer 22.

The interval between the surface 22A and the back surface 22B of the semiconductor layer 22 in the transistor area D is referred to as the interval P. The interval between the surface 22A and the back surface 22B of the semiconductor layer 22 in the diode area C is referred to as the interval Q. The interval P is the thickness of the semiconductor layer 22 in the transistor area D. The interval Q is the thickness of the semiconductor layer 22 in the diode area C. The interval P is larger than the interval Q. The difference between interval P and the interval Q is, for example, 1 µm or more. In other words, the semiconductor layer 22 in the diode area C is 1 µm or more thinner than the semiconductor layer 22 in the transistor area D.

On the entire surface portion of the semiconductor layer 22 in the transistor area D, a $p^-$-type semiconductor layer 31 is formed. The area closer to the back surface 22B as compared with the $p^-$-type semiconductor layer 31 on the semiconductor layer 22 is the $n^-$-type semiconductor layer 34. The $n^+$-type semiconductor layer 32 is selectively formed on the surface portion of the $p^-$-type semiconductor layer 31. On the surface of the n$^+$-type semiconductor layer 32, in the same plane of the surface of the p$^-$-type semiconductor layer 31 where the n$^+$-type semiconductor layer 32 is not formed, the surface 22A of the semiconductor layer 22 in the transistor area D is formed.

The first trench 12 is formed on the semiconductor layer 22 in the transistor area D. The first trench 12 is dug from the surface 22A to the back surface 22B of the semiconductor layer 22 in the transistor area D. The first trench 12 penetrates through both the n$^+$-type semiconductor layer 32 and the p$^-$-type semiconductor layer 31 to reach the middle thickness of the n$^-$-type semiconductor layer 34. The interval R between the bottom 12A (bottom 12A indicated by the solid line) of the first trench 12 and the back surface 22B of the semiconductor layer 22 is smaller than the interval P, and is equal to the interval Q. In other words, the bottom 12A of the first trench 12 and the surface 22A of the semiconductor layer 22 in the diode area C are located at the same level of thickness of the semiconductor layer 22, and thus are located in the same plane. The depth of the first trench 12 is, for example, 1 μm or more.

The gate insulating film 23 contains SiO$_2$ and is connected to the entire inner surface (the sidewall and the bottom) of the first trench 12.

The gate electrode 24 contains, for example, polysilicon. The gate electrode 24 is embedded in the inner side of the gate insulating film 23 in the first trench 12.

The oxide film 25 contains SiO$_2$, and covers substantially the entire surface 22A of the semiconductor layer 22 in the transistor area D.

The insulating layer 26 contains a glass like BPSG (Boron Phosphor Silicate Glass), and is stacked on the oxide film 25.

The second trench 13 is dug from the surface (the upper surface in FIG. 1) of the insulating layer 26, penetrates through the insulating layer 26 and the oxide film 25, and penetrates through n$^+$-type semiconductor layer 32 in the semiconductor layer 22 to reach the middle thickness of the p$^-$-type semiconductor layer 31. The second trench 13 is located on the semiconductor layer 22 in the transistor area D, and is formed at a position other than the first trench 12, and is dug from the surface 22A of the semiconductor layer 22 at the position. The interval S between the bottom 13A of the second trench 13 and the back surface 22B of the semiconductor layer 22 is smaller than the interval P, and is larger than the interval Q and the interval R. In other words, the surface 22A of the semiconductor layer 22 in the diode area C is located at a deeper position than the bottom 13A of the second trench 13.

The p$^+$-type semiconductor layer 33 surrounds the second trench 13 of the p$^-$-type semiconductor layer 31.

The first metal film 27 includes a Schottky bonded metal (e.g. Ti, Mo, Pd or TiN) formed by bonding with the n$^-$-type silicon. The first metal film 27 is connected with the entire inner surface of the second trench 13, and in this state, is electrically connected (in ohmic contact) with the n$^+$-type semiconductor layer 32 and the p$^+$-type semiconductor layer 33. In this manner, the second trench 13 is the contact part for contacting the n$^+$-type semiconductor layer 32 and the p$^+$-type semiconductor layer 33.

In addition, the first metal film 27 covers the surface and the gradient surface of the insulating layer 26, the gradient surface of the oxide film 25, the portion of the surface 22A of the semiconductor layer 22 in the transistor area D not covered by the oxide film 25, the gradient surface 22C forming the boundary of the diode area C and the transistor area D on the semiconductor layer 22, and the surface 22A of the semiconductor layer 22 in the diode area C. The first metal film 27 is Schottky bonded relative to the surface 22A of the semiconductor layer 22 in the diode area C (n$^-$-type semiconductor layer 34) and the gradient surface 22C of the n$^-$-type semiconductor layer 34. The gradient surface 22C is perpendicular to the surface 22A.

The source electrode 28 contains, for example, Wu. The source electrode 28 is embedded in the inner side of the second trench 13 where the first metal film 27 is formed on the inner surface thereof.

The second metal film 29 contains Ti or TiN, and covers the entire surface (the upper surface in FIG. 5) of the first metal film 27 and the surface of the source electrode 28 exposed from the second trench 13.

The wiring layer 30 contains, for example, an AlCu alloy. The wiring layer 30 is stacked on the second metal film 29 and covers the entire surface (the upper surface in FIG. 5) of the second metal film 29. The wiring layer 30 is electrically connected to the corresponding external electrode among the plurality of external electrodes 2 (see FIG. 1 and FIG. 2). The gate electrode 24 is electrically connected to the corresponding external electrode 2 by a switching wiring, which is not shown.

In the transistor area D, the wiring layer 30, the second metal film 29, the source electrode 28, the first metal film 27, the n$^+$-type semiconductor layer 32 and the p$^+$-type semiconductor layer 33 are electrically connected. The back surface electrode 21, the semiconductor substrate 20, the n$^-$-type semiconductor layer 34 closer to the semiconductor substrate 20 as compared with the p$^-$-type semiconductor layer 31 on the semiconductor layer 22 are electrically connected.

In this way, in the transistor area D, every transistor unit 11A is constituted. In the transistor unit 11A, the p$^-$-type semiconductor layer 31 is the main area, the semiconductor substrate 20 and the n$^-$-type semiconductor layer 34 are the drain area, and the n$^+$-type semiconductor layer 32 is the source area. The transistor unit 11A (transistor 11) has the first trench 12 in which the gate electrode 24 is embedded, so the transistor unit 11A is the trench gate-type MOSFET (Metal Oxide Semiconductor Field Effect Transistor). In the transistor unit 11A, a parasitic diode is constituted by the p$^-$-type semiconductor layer 31 and the n$^-$-type semiconductor layer 34.

For example, in the situation where the source electrode 28 (wiring layer 30) is grounded and a positive voltage is applied on the back surface electrode 21, a voltage higher than a threshold is applied on the gate electrode 24. In this manner, a channel is formed in a channel area X around the interface of the p$^-$-type semiconductor layer 31 and the gate insulating film 23 on the outer side of the gate electrode 24, and allows the current to pass therethrough from the back surface electrode 21 to the source electrode 28.

In the diode area C, the back surface electrode 21 is in ohmic contact with the semiconductor substrate 20, and the first metal film 27 is Schottky bonded with the surface 22A and the gradient surface 22C of the semiconductor layer 22, thereby constituting the Schottky barrier diode 10.

The smaller the interval Q between the surface 22A and the back surface 22B of the semiconductor layer 22 in the diode area C is, the larger the difference between the interval Q and the interval P between the surface 22A and the back surface 22B of the semiconductor layer 22 in the transistor area D will be. In this situation, the DC resistance of the semiconductor layer 22 of the Schottky barrier diode 10 is reduced, and the Schottky bonding surface of the gradient surface 22C is enlarged, thus reducing the forward voltage of the Schottky barrier diode 10 and improving the performance of the Schottky barrier diode 10. However, to ensure the minimum level of the withstand voltage of the Schottky barrier diode 10, the interval Q preferably is 2.5 μm or more.

FIG. 6A to FIG. 6M are illustrative cross-sectional views of a fabricating method of the semiconductor device in FIG. 5.

Figure 6A:
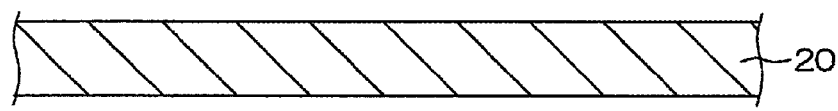
FIG. 6A is an illustrative cross-sectional view of a fabricating method of the semiconductor device in FIG. 5.

Firstly, as shown in FIG. 6A, the semiconductor substrate 20 is fabricated in a method commonly known in this field.

Figure 6B:
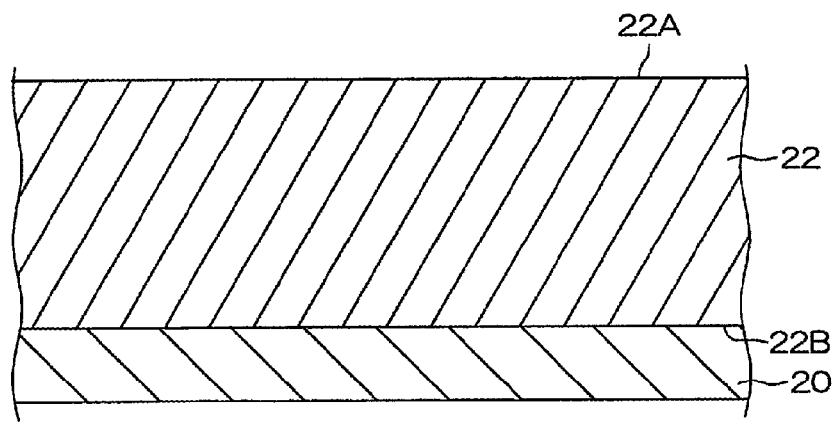
FIG. 6B is an illustrative cross-sectional view of a step subsequent to FIG. 6A.

Next, as shown in FIG. 6B, the epitaxial growth is carried out on the surface of the semiconductor substrate 20, thus forming the semiconductor layer 22 on the semiconductor substrate 20.

Figure 6C:
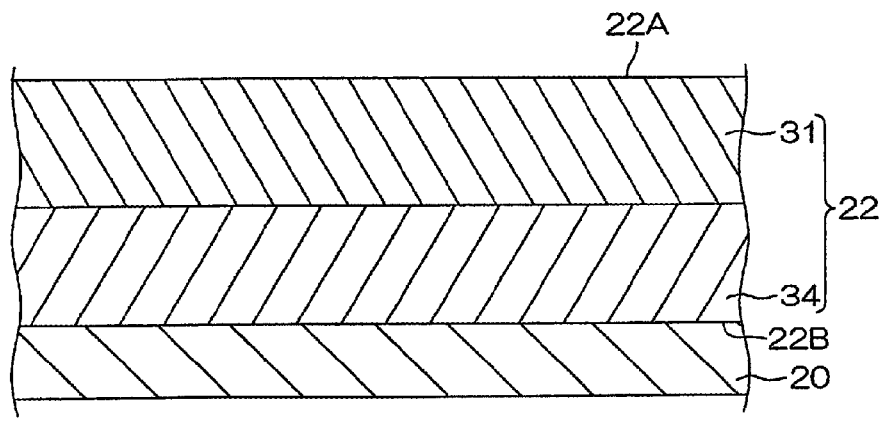
FIG. 6C is an illustrative cross-sectional view of a step subsequent to FIG. 6B.

Subsequently, an ion implantation of a p-type foreign matter (e.g. B) is carried out on the surface portion of the semiconductor layer 22. Then, the p-type foreign matter is activated by an annealing process, as shown in FIG. 6C, the $p^-$-type semiconductor layer 31 is formed on the surface portion of the semiconductor layer 22. The portion closer to the semiconductor substrate 20 as compared with the $p^-$-type semiconductor layer 31 on the semiconductor layer 22 is the $n^-$-type semiconductor layer 34.

Figure 6D:
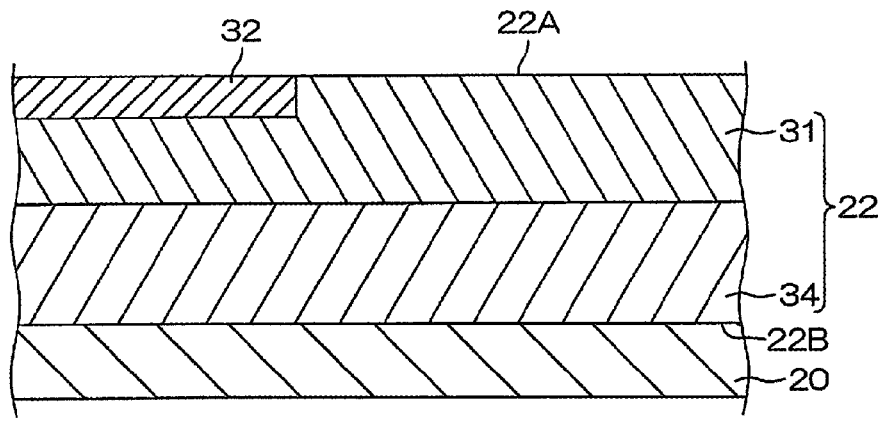
FIG. 6D is an illustrative cross-sectional view of a step subsequent to FIG. 6C.

After that, a selective ion implantation of an n-type foreign matter (e.g. PAs) is carried out on the surface portion of the $p^-$-type semiconductor layer 31. Then, the n-type foreign matter is activated by the annealing process, as shown in FIG. 6D, the $n^+$-type semiconductor layer 32 is formed on the surface portion of the $p^-$-type semiconductor layer 31.

Figure 6E:
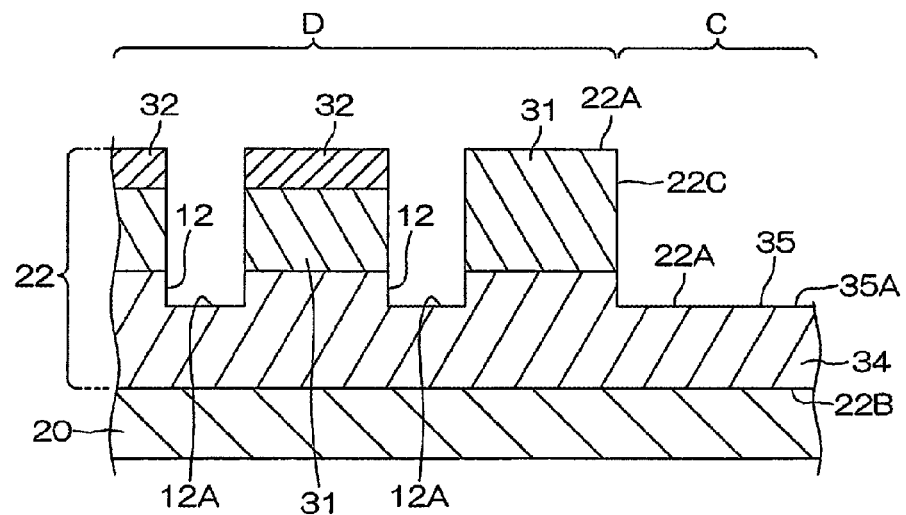
FIG. 6E is an illustrative cross-sectional view of a step subsequent to FIG. 6D.

Thereafter, an etching process is carried out with the anticorrosive agent pattern (not shown) as the mask so as to dig from the surface 22A of the semiconductor layer 22. As shown in FIG. 6E, a recessed portion 35 is recessed from the back surface 22B on the semiconductor layer 22 in the diode area C. The first trench 12 is formed on the semiconductor layer 22 in the transistor area D. The bottom 35A of the recessed portion 35 and the bottom 12A of the first trench 12 are located at the same position in the thickness direction of the semiconductor layer 22 and in the same plane.

Figure 6F:
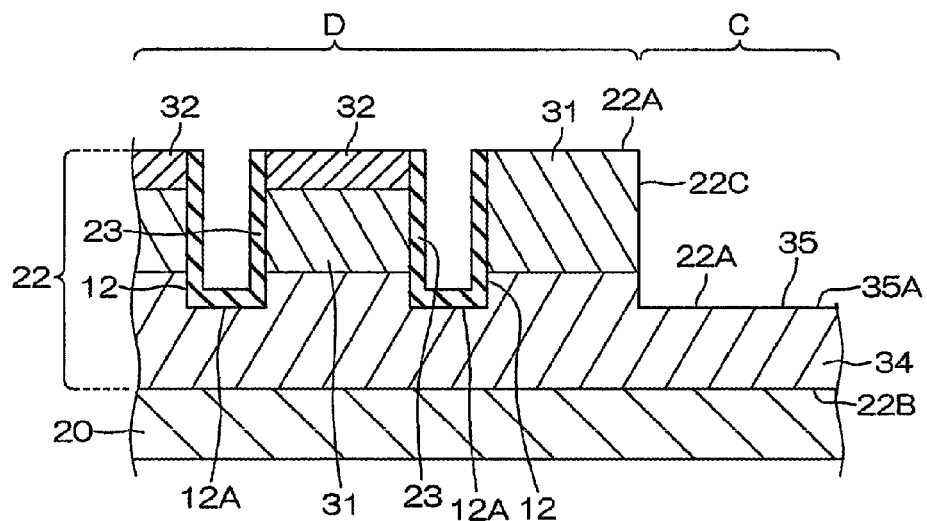
FIG. 6F is an illustrative cross-sectional view of a step subsequent to FIG. 6E.

Then, the $SiO_2$-containing gate insulating film 23 is formed on the entire inner surface of the first trench 12 by e.g. a CVD (Chemical Vapor Deposition) process as shown in FIG. 6F.

Figure 6G:
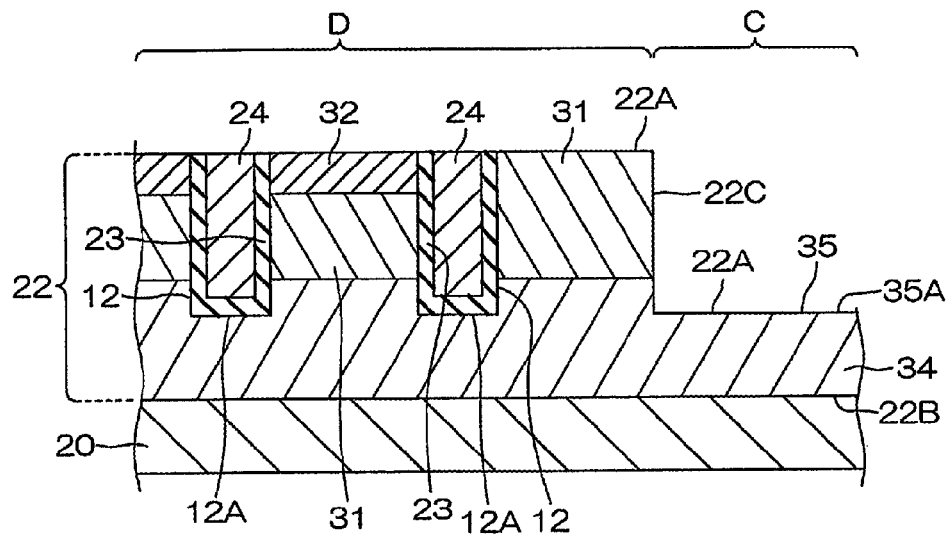
FIG. 6G is an illustrative cross-sectional view of a step subsequent to FIG. 6F.

Afterwards, a polysilicon-containing gate electrode 24 is embedded in the inner side of the gate insulating film 23 of the first trench 12 as shown in FIG. 6G.

Figure 6H:
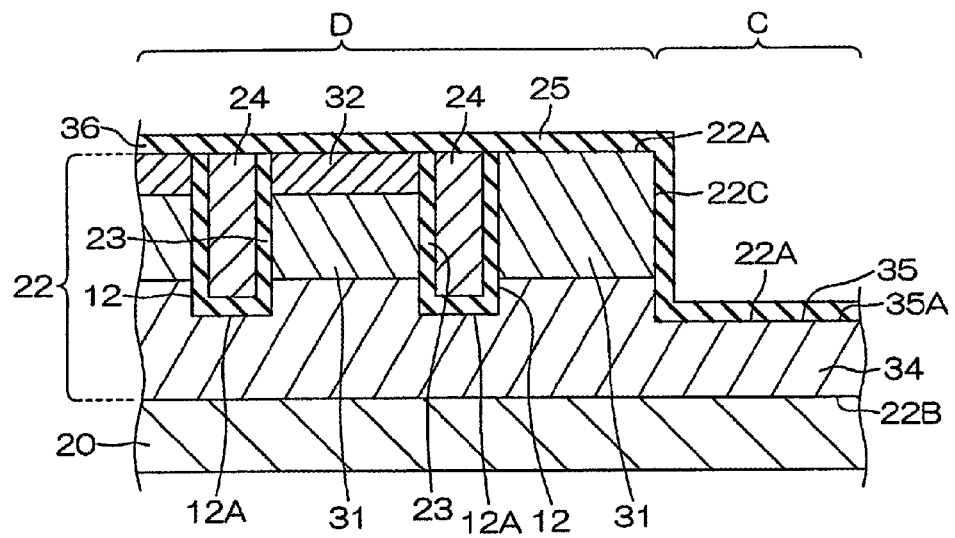
FIG. 6H is an illustrative cross-sectional view of a step subsequent to FIG. 6G.

Then, a $SiO_2$-containing film ($SiO_2$ film) 36 is formed on the surface 22A of the semiconductor layer 22 in the diode area C and the transistor area D and the entire area of the gradient surface 22C of the semiconductor layer 22 on the boundary in the diode area C and the transistor area D by, for example, the CVD process as shown in FIG. 6H.

Figure 6I:
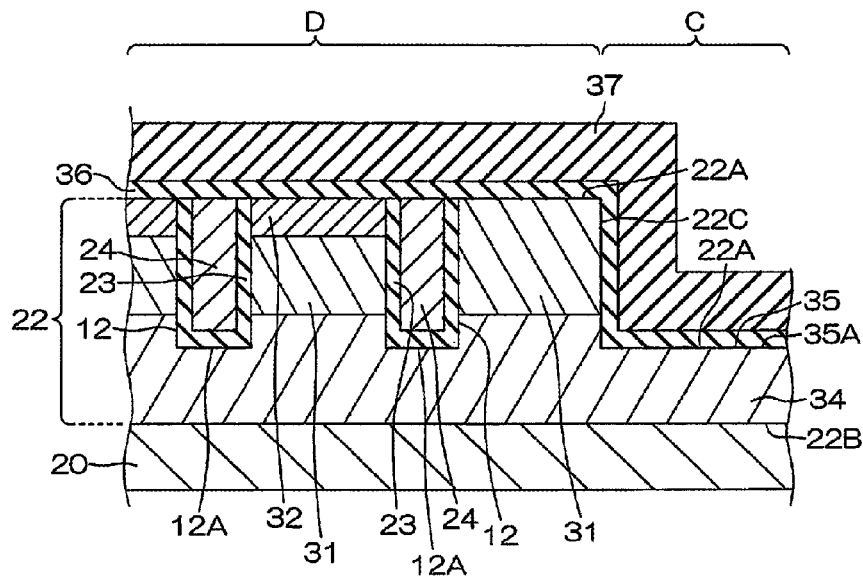
FIG. 6I is an illustrative cross-sectional view of a step subsequent to FIG. 6H.

Then, the glass layer (glass layer) 37 that contains BPSG is stacked on the $SiO_2$ film 36 by means of, for example, the high density CVD process as shown in FIG. 6I.

Figure 6J:
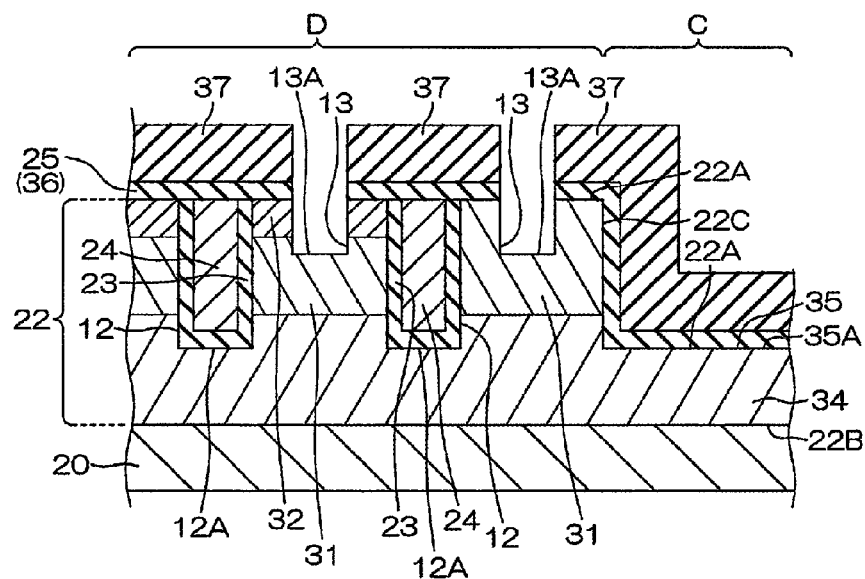
FIG. 6J is an illustrative cross-sectional view of a step subsequent to FIG. 6I.

Subsequently, an etching process is carried out with the anticorrosive agent pattern (not shown) as the mask so as to sequentially dig the glass layer 37, the $SiO_2$ film 36 and the semiconductor layer 22 in the transistor area D. The second trench 13 is thus formed in the transistor area D as shown in FIG. 6J.

Figure 6K:
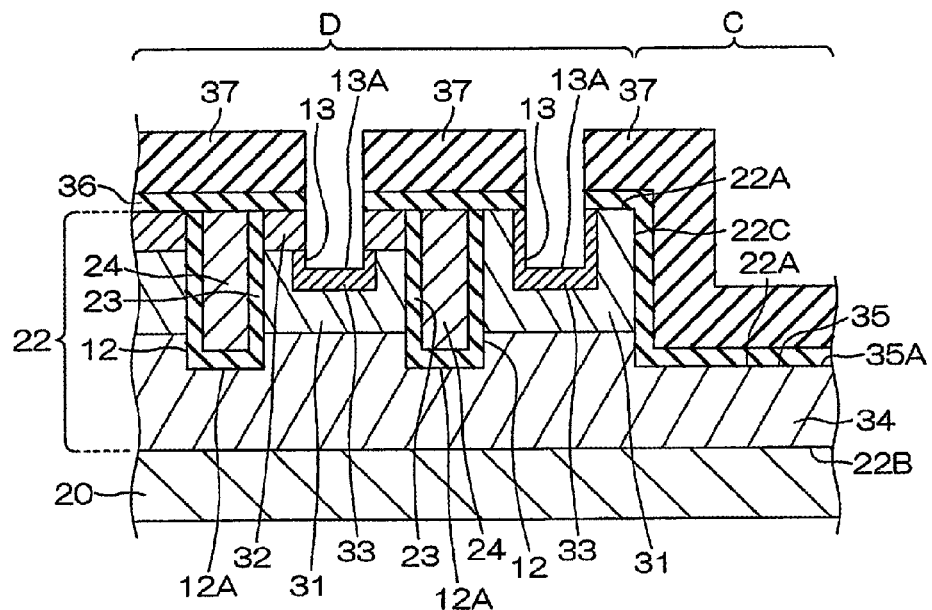
FIG. 6K is an illustrative cross-sectional view of a step subsequent to FIG. 6J.

Next, a selective ion implantation of the p-type foreign matter (e.g. B) is carried out on the surface of the semiconductor layer 22 through the second trench 13. Then, the p-type foreign matter is activated by the annealing process as shown in FIG. 6K, the $p^+$-type semiconductor layer 33 is formed on the area around the second trench 13 of the $p^-$-type semiconductor layer 31.

Figure 6L:
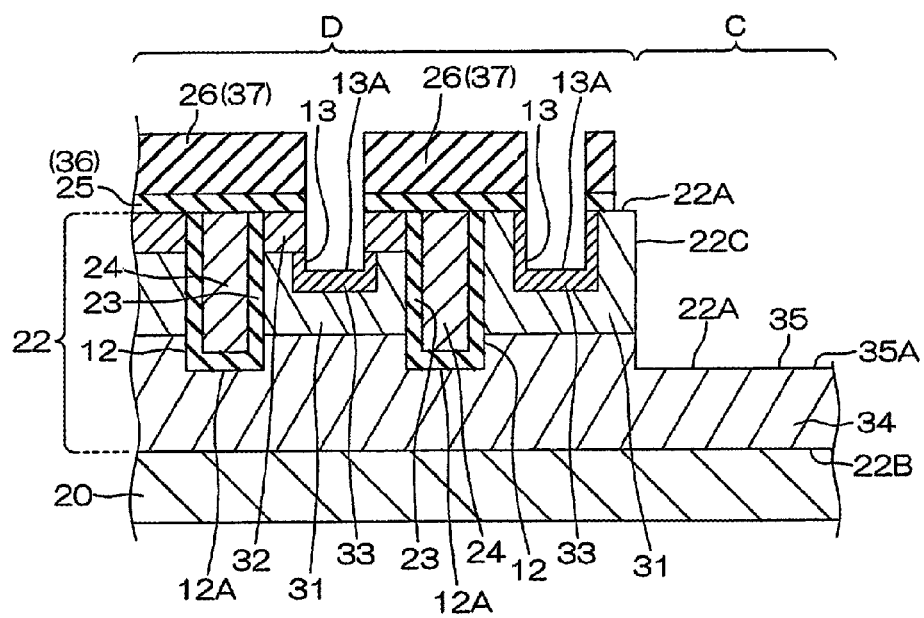
FIG. 6L is an illustrative cross-sectional view of a step subsequent to FIG. 6K.

Subsequently, an etching process is carried out with the anticorrosive agent pattern (not shown) as the mask so as to selectively remove the $SiO_2$ film 36 and the glass layer 37, as shown in FIG. 6L, and the residues of the $SiO_2$ film 36 and the glass layer 37 are left in the transistor area D. The residual $SiO_2$ film 36 is the oxide film 25, and the residual glass layer 37 is the insulating layer 26.

Figure 6M:
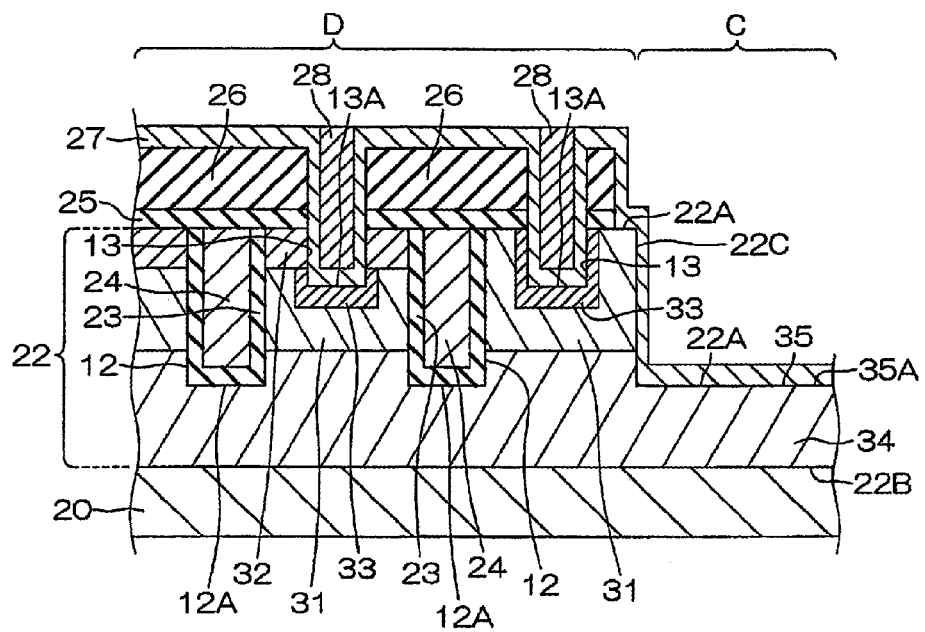
FIG. 6M is an illustrative cross-sectional view of a step subsequent to FIG. 6L.

Afterwards, as shown in FIG. 6M, a Ti-containing first metal film 27 is formed on the entire inner surface of the second trench 13, the surface and gradient surface of the insulating layer 26, and the entire area exposed by the gradient surface of the oxide film 25 and the surface 22A and the gradient surface 22C of the semiconductor layer 22 in the transistor area D and the diode area C.

Then, a Wu-containing source electrode 28 is embedded in the inner side of the first metal film 27 of the second trench 13.

After that, a Ti-containing second metal film 29 is formed on the entire surface of the first metal film 27 and on the surface of the source electrode 28 exposed from the second trench 13. In addition, an Al-containing wiring layer 30 is stacked on the second metal film 29. After a back surface electrode 21 is formed on the back surface of the semiconductor substrate 20, the semiconductor device 1 as shown in FIG. 5 is finished. Furthermore, in this embodiment, the first trench 12 is formed simultaneously when forming the recessed portion 35 (see FIG. 6E); but this is only an example, and the fabricating steps may be altered. For example, the second trench 13 (see FIG. 6J) is formed simultaneously when forming the recessed portion 35.

Figure 7:
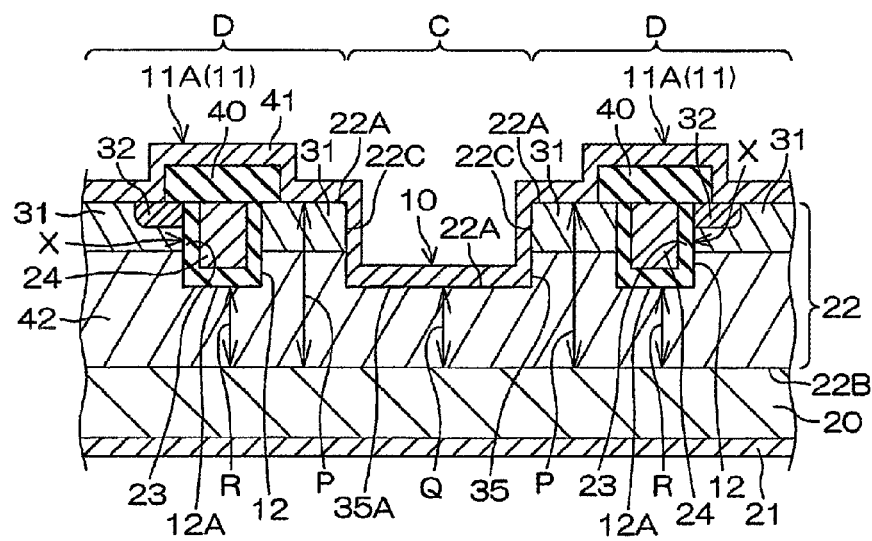
FIG. 7 is an illustrative cross-sectional view of a semiconductor device according to another embodiment of the present invention.
Figure 8:
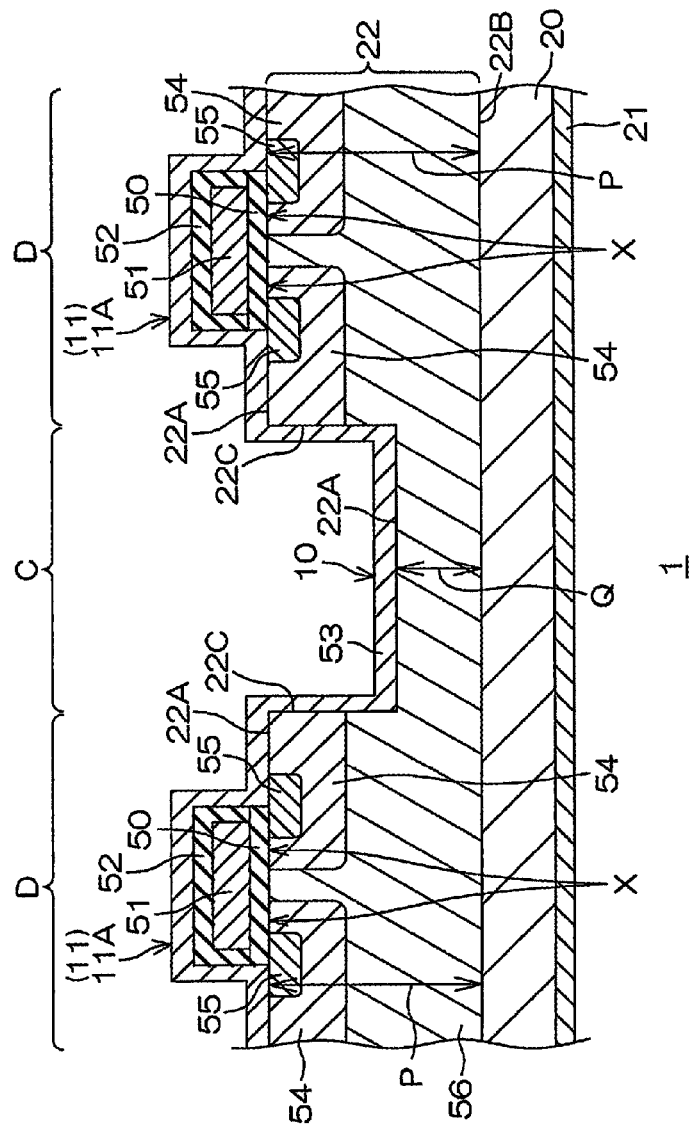
FIG. 8 is an illustrative cross-sectional view of a semiconductor device according to another embodiment of the present invention.

FIG. 7 and FIG. 8 are illustrative cross-sectional views of a semiconductor device according to the other embodiment of the present invention.

Hereinafter, some other embodiments different from the above embodiment are illustrated, wherein the same parts in the following embodiments that correspond to the above embodiment are given the same reference numerals, and the details of the description of the same parts are omitted. In both FIG. 7 and FIG. 8, when observed from the top, the transistor area D surrounds the diode area C (see FIG. 1 and FIG. 2).

The semiconductor device 1 in FIG. 7 similar to the above embodiment also includes the trench gate-type MOSFET, but does not have the second trench 13 (see FIG. 5).

The semiconductor device 1 in FIG. 7 has a semiconductor substrate 20, a back surface electrode 21, a semiconductor layer 22, a gate insulating film 23 and a gate electrode 24, an insulating layer 40 and a metal film 41.

The semiconductor substrate 20 contains the $n^+$-type semiconductor. The back surface electrode 21 covers the entire back surface (FIG. 7 the lower surface in FIG. 7) of the semiconductor substrate 20, and is in ohmic contact with the back surface of the semiconductor substrate 20.

The semiconductor layer 22 is epitaxially grown and stacked on the surface of the semiconductor substrate 20 (the upper surface in FIG. 7). The semiconductor layer 22 contains an $n^-$-type semiconductor having a concentration lower than the semiconductor substrate 20. In the semiconductor layer 22 in FIG. 7, the upper surface is referred to as the surface 22A, and the lower surface is referred to as the back surface 22B.

FIG. 7 illustrates the semiconductor layer 22 near the boundary of the diode area C and the transistor area D. The semiconductor layer 22 in the diode area C is thinner than the semiconductor layer 22 in the transistor area D. Therefore, the surface 22A of the semiconductor layer 22 in the diode area C is located at a deep position closer to the semiconductor substrate 20 as compared with the surface 22A of the semiconductor layer 22 in the transistor area D. Therefore, the surface 22A of the semiconductor layer 22 is recessed towards the semiconductor substrate 20 in the diode area C. The interval P between the surface 22A and the back surface 22B of the semiconductor layer 22 in the transistor area D is larger than the interval Q between the surface 22A and the back surface 22B of the semiconductor layer 22 in the diode area C. The thickness of the semiconductor layer 22 in the diode area C is 2.5 μm or more.

The p⁻-type semiconductor layer 31 is formed on the entire surface of the semiconductor layer 22 in the transistor area D. The n⁺-type semiconductor layer 32 is selectively formed on the surface portion of the p⁻-type semiconductor layer 31. The surface of the n⁺-type semiconductor layer 32 and the surface area of the p⁻-type semiconductor layer 31 where the n⁺-type semiconductor layer 32 is not formed are in the same plane, thus forming the surface 22A of the semiconductor layer 22 in the transistor area D.

The first trench 12 having the depth of 1 μm or more is formed on the semiconductor layer 22 in the transistor area D. The first trench 12 is dug from the surface 22A to the back surface 22B of the semiconductor layer 22 in the transistor area D. The first trench 12 penetrates through the p⁻-type semiconductor layer 31 at the position adjacent to the n⁺-type semiconductor layer 32, to reach the middle of the area (referred to as the n⁻-type semiconductor layer 42) closer to the back surface 22B as compared with the p⁻-type semiconductor layer 31 of the semiconductor layer 22. The interval R between the bottom 12A of the first trench 12 and the back surface 22B of the semiconductor layer 22 is smaller than the interval P, and is equal to the interval Q. In other words, the bottom 12A of the first trench 12 and the surface 22A of the semiconductor layer 22 in the diode area C are located at the same position in the thickness direction of the semiconductor layer 22 and are located in the same plane.

The gate insulating film 23 contains $SiO_2$ and is formed on the entire inner surface of the first trench 12.

The gate electrode 24 contains polysilicon and is embedded in the inner side of the gate insulating film 23 of the first trench 12.

The insulating layer 40 contains $SiO_2$, and selectively covers the surface 22A of the semiconductor layer 22 in the transistor area D. The insulating layer 40 covers the entire surface of the gate electrode 24 protruding from the surface 22A of the semiconductor layer 22 (the upper surface in FIG. 7), and is connected with the gate insulating film 23 around the gate electrode 24, and meanwhile contacts the surface portions of the n⁺-type semiconductor layer 32 and the p⁻-type semiconductor layer 31 around the first trench 12.

The metal film 41 contains a Schottky bonded metal (Ti, Mo, Pd or TiN) formed by bonding with the n⁻-type silicon. The metal film 41 covers the entire surface 22A of the respective semiconductor layer 22 in the diode area C and the transistor area D and the entire area of the gradient surface 22C forming the boundary of the diode area C and the transistor area D on the semiconductor layer 22. The metal film 41 is Schottky bonded with the surface 22A and the gradient surface 22C of the semiconductor layer 22 in the diode area C (n⁻-type semiconductor layer 42). The metal film 41 is electrically connected with corresponding external electrodes 2 among the plurality of external electrodes 2 (see FIG. 1 and FIG. 2). The gate electrode 24 is electrically connected with the corresponding external electrode 2 by a switching wiring which is not shown.

In the semiconductor device 1, the metal film 41, the p⁻-type semiconductor layer 31, and the n⁺-type semiconductor layer 32 are electrically connected. The back surface electrode 21, the semiconductor substrate 20, and the n⁻-type semiconductor layer 42 on the semiconductor layer 22 closer to the semiconductor substrate 20 as compared with the p⁻-type semiconductor layer 31 are electrically connected.

The n⁻-type semiconductor layer 42 becomes the drain area. The n⁺-type semiconductor layer 32 becomes the source area. The p⁻-type semiconductor layer 31 becomes the main area. A parasitic diode is constituted by the p⁻-type semiconductor layer 31 and the n⁻-type semiconductor layer 42 in the transistor unit 11A.

For example, in the situation that the metal film 41 is grounded and the positive voltage is applied on the back surface electrode 21, a voltage higher than a threshold is applied on the gate electrode 24. In this manner, a channel is formed in a channel area X around the interface of the p⁻-type semiconductor layer 31 and the gate insulating film 23 on the outer side of the gate electrode 24, and allows the current to pass therethrough from the back surface electrode 21 to the metal film 41.

In the diode area C, the back surface electrode 21 is in ohmic contact with the semiconductor substrate 20, and the metal film 41 is Schottky bonded with the surface 22A of the semiconductor layer 22, thereby constituting the Schottky barrier diode 10.

The transistor 11 (transistor unit 11A) of the semiconductor device 1 in FIG. 8 is a planar MOSFET different from this embodiment, and does not have the first trench 12 (see FIG. 5 and FIG. 7).

The semiconductor device 1 in FIG. 8 has a semiconductor substrate 20, a back surface electrode 21 and a semiconductor layer 22, a gate insulating film 50, a gate electrode 51, an insulating film 52 and a metal film 53.

The semiconductor substrate 20 contains the n⁺-type semiconductor. The back surface electrode 21 covers the entire back surface (the lower surface in FIG. 8) of the semiconductor substrate 20, and is in ohmic contact with the back surface of the semiconductor substrate 20.

The semiconductor layer 22 is epitaxially grown and stacked on the surface of the semiconductor substrate 20 (the upper surface in FIG. 8). The semiconductor layer 22 contains an n⁻-type semiconductor having a concentration lower than the semiconductor substrate 20. In the semiconductor layer 22 in FIG. 8, the upper surface is referred to as the surface 22A, and the lower surface is referred to as the back surface 22B.

FIG. 8 illustrates the semiconductor layer 22 near the boundary of the diode area C and the transistor area D. The semiconductor layer 22 in the diode area C is thinner than the semiconductor layer 22 in the transistor area D. Therefore, the semiconductor layer 22 in the diode area C is located at a deep position closer to the semiconductor substrate 20 as compared with the surface 22A of the semiconductor layer 22 in the transistor area D. Therefore, the surface 22A of the semiconductor layer 22 is recessed towards the semiconductor substrate 20 in the diode area C. The interval P between the surface 22A and the back surface 22B of the semiconductor layer 22 in the transistor area D is larger than the interval Q between the surface 22A and the back surface 22B of the semiconductor layer 22 in the diode area C. The semiconductor layer 22 in the diode area C is 2.5 μm thick or more.

The p⁻-type semiconductor layer 54 is selectively formed on the surface portion of the semiconductor layer 22 in the transistor area D. A plurality of p⁻-type semiconductor layers 54 is formed, and is discretely configured on the surface portion of the semiconductor layer 22. The n⁺-type semiconductor layer 55 is formed on the surface portion of each p⁻-type semiconductor layer 54. The surface of the n⁺-type semiconductor layer 55 and the surface area of the p⁻-type semiconductor layer 54 where the n⁺-type semiconductor layer 55 is not formed are in the same plane, thus forming the surface 22A of the semiconductor layer 22 in the transistor area D.

The gate insulating film 50 contains SiO₂, and partially covers the surface 22A of the semiconductor layer 22 in the transistor area D. The gate insulating film 50 is formed on the surface 22A of the semiconductor layer 22 in the transistor area D at an interval and spans the adjacent n⁺-type semiconductor layers 55.

The gate electrode 51 contains, for example, polysilicon, and is stacked on the gate insulating film 50.

The insulating film 52 contains SiO₂. The insulating film 52 covers the entire surface portion of the gate electrode 51 which is not in contact with the gate insulating film 50. The insulating film 52 and the gate insulating film 50 are connected.

The metal film 53 contains a Schottky bonded metal (Ti, Mo, Pd or TiSi) formed by bonding with the n⁻-type silicon. The metal film 53 covers the insulating film 52, the entire surface 22A of the respective semiconductor layer 22 in the diode area C and the transistor area D, and the entire area of the gradient surface 22C forming the boundary of the diode area C and the transistor area D of the semiconductor layer 22. The metal film 53 is Schottky bonded with the surface 22A and the gradient surface 22C of the semiconductor layer 22 in the diode area C (strictly referred to as the following n⁻-type semiconductor layer 56). The metal film 53 is electrically connected with corresponding external electrodes among the plurality of external electrodes 2 (see FIG. 1 and FIG. 2). The gate electrode 51 is electrically connected with the corresponding external electrode 2 by a switching wiring which is not shown.

In the semiconductor device 1, the metal film 53, the p⁻-type semiconductor layer 54, and the n⁺-type semiconductor layer 55 are electrically connected. The back surface electrode 21, the semiconductor substrate 20, and the portion of the semiconductor layer 22 where the p⁻-type semiconductor layer 54 and n⁺-type semiconductor layer 55 (referred to as the n⁻-type semiconductor layer 56) are not formed are electrically connected.

Therefore, a plurality of the transistor units 11A is constituted in the transistor area D. The semiconductor substrate 20 and the n⁻-type semiconductor layer 56 become the drain area. The n⁺-type semiconductor layer 55 becomes the source area. The p⁻-type semiconductor layer 54 becomes the main area. In the transistor unit 11A, the parasitic diode is constituted by the p⁻-type semiconductor layer 54 and the n⁻-type semiconductor layer 56.

For example, in the situation that the metal film 53 is grounded and the positive voltage is applied on the back surface electrode 21, a voltage higher than a threshold is applied on the gate electrode 51. In this manner, a channel is formed in a channel area X around the interface of the p⁻-type semiconductor layer 54 and the gate insulating film 50 and allows the current to pass therethrough from the back surface electrode 21 to the metal film 53.

In the diode area C, the back surface electrode 21 is in ohmic contact with the semiconductor substrate 20, and the metal film 53 is Schottky bonded with the surface 22A and the gradient surface 22C of the semiconductor layer 22 (the n⁻-type semiconductor layer 56), thereby constituting the Schottky barrier diode 10.

Figure 9:
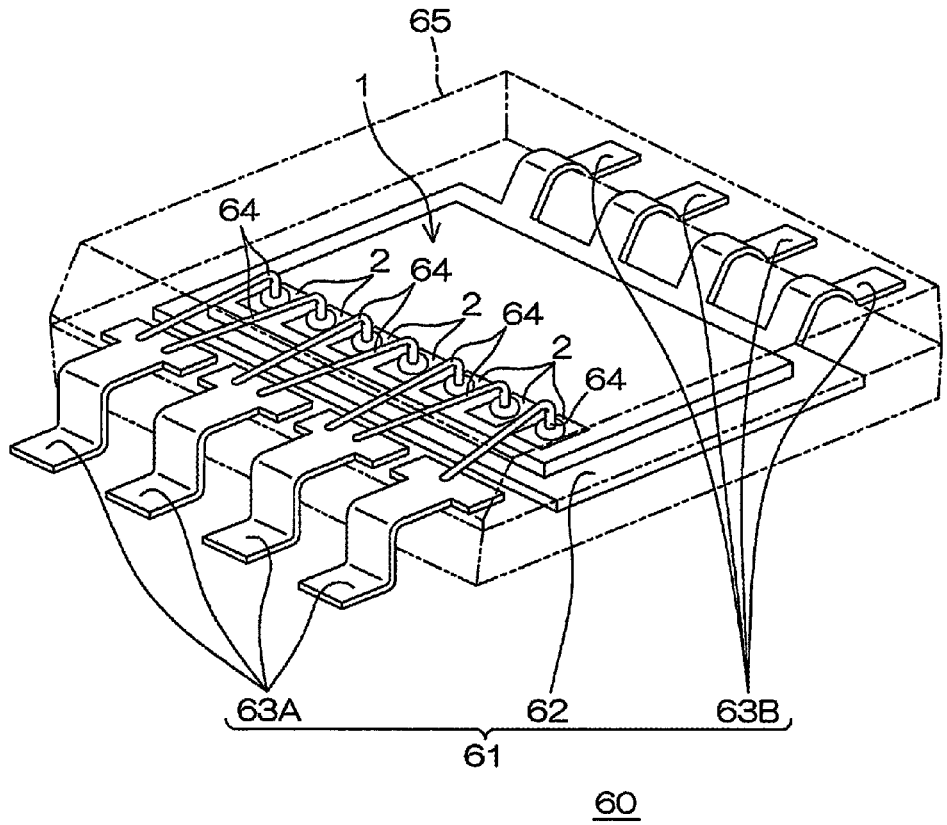
FIG. 9 is a schematic perspective view of a semiconductor package according to an embodiment of the present invention.

FIG. 9 is a schematic perspective view of a semiconductor package according to an embodiment of the present invention.

Referring to FIG. 9, the semiconductor package 60 includes any of the above semiconductor devices 1, a metal lead frame 61, and a resin package 65.

The semiconductor device 1 is bonded on the lead frame 61. The lead frame 61 includes a rectangular flat chip pad 62, leads 63A configured at an interval on one side of the chip pad 62, and leads 63B extending out from the other side of the chip pad 62. The number of leads 63A and leads 63B are respectively plural (four each are used herein by way of example).

In the semiconductor device 1, the back surface electrode 21 (see FIG. 5, FIG. 7 and FIG. 8) is the upper surface bonded on the chip pad 62, and each lead 63A is connected with the corresponding external electrode 2 on the surface of the semiconductor device 1 surface by a connecting line 64. The leads 63A ands 63B are thereby electrically connected to the Schottky barrier diode 10 and transistor 11 in the semiconductor device 1 (see FIG. 1 and FIG. 2). In FIG. 9, the external electrode 2 on the right end is connected to the gate electrode 24, and another external electrode 2 is connected to the source electrode 28 (also see FIG. 5). In this situation, in FIG. 9, the lead 63A on the right end is a gate lead, and the other 3 leads 63A are source leads. All the leads 63B are drain leads.

The semiconductor device 1 and the lead frame 61 which are bonded together are covered by the resin package 65 in a manner that the leads 63A and the leads 63B are exposed. The semiconductor package 60 makes the leads 63A and the leads 63B opposing to the mounting wiring substrate (not shown), and may be connected (mounted) to the mounting wiring substrate.

Figure 10:
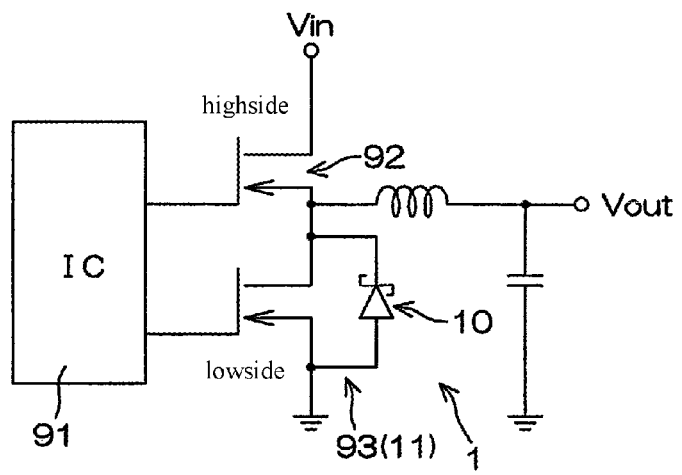
FIG. 10 is a circuit diagram of a DC-DC converter adopting the semiconductor device of the present invention.

FIG. 10 is a circuit diagram of a DC-DC converter adopting the semiconductor device of the present invention.

In the DC-DC converter 100 of FIG. 10, a control portion (IC) 91 is connected with a highside transistor 92 and a lowside transistor 93. The semiconductor device 1 of the present invention may be used as the lowside transistor 93. In this situation, the transistor 11 of the semiconductor device 1 becomes the lowside transistor 93, and the Schottky barrier diode 10 connects the transistor 92 and the lowside transistor 93

As described above, in the semiconductor device 1, the semiconductor layer 22 in the diode area C is thinner than the semiconductor layer 22 in the transistor area D (see FIG. 5, FIG. 7 and FIG. 8). In this manner, in the transistor area D, the thickness of the semiconductor layer 22 may be set to the necessary thickness for ensuring the withstand voltage of the transistor 11 (every transistor unit 11A). On the other hand, in the diode area C, the thickness of the semiconductor layer 22 may be set to the minimum necessary level. This allows a DC resistance of the Schottky barrier diode to be reduced, thereby reducing the forward voltage. In other words, the thickness of the semiconductor layer 22 in the transistor area D and the diode area C are respectively optimized. Therefore, the present composition of the transistor 11 and the Schottky barrier diode 10 formed on the chip ensures the withstand voltage of the transistor 11 and reduces the forward voltage of the Schottky barrier diode 10.

The semiconductor layer 22 in the diode area C is 2.5 μm thick or more, so as to ensure the minimum level withstand voltage of the Schottky barrier diode 10.

In the trench-type transistor 11 (the transistor unit 11A), the bottom 12A of the first trench 12, and the surface 22A of the semiconductor layer 22 in the diode area C are located at the same position in the thickness direction of the semiconductor layer 22 (see FIG. 5 and FIG. 7). Thus, the steps of forming the first trench 12 and polishing the surface 22A of the semiconductor layer 22 in the diode area C to make the semiconductor layer thinner (the step of forming the recessed portion 35) may be carried out in one step (see FIG. 6E). Therefore, the cost of fabricating the semiconductor device 1 may be reduced by decreasing the number of steps. A cheap and high-performance semiconductor device 1 can thus be provided.

However, where the number of steps is not a concern, in the thickness direction of the semiconductor layer 22, the bottom 12A of the first trench 12 indicated by the solid line in FIG. 5 is located at a position further away from a back surface 22B of the semiconductor layer 22 as compared with the surface 22A of the semiconductor layer 22 in the diode area C. In this situation, the interval R' (see FIG. 5) between the bottom 12A of the first trench 12 and the back surface 22B of the semiconductor layer 22 is larger than the interval Q between the surface 22A and the back surface 22B of the semiconductor layer 22 in the diode area C.

In the thickness direction of the semiconductor layer 22, the bottom 12A of the first trench 12 may also be located at a position closer to the back surface 22B of the semiconductor layer 22 as compared with the surface 22A of the semiconductor layer 22 in the diode area C, as indicated by the dashed line in FIG. 5. In this situation, an interval R" (see FIG. 5) between the bottom 12A of the first trench 12 and the back surface 22B of the semiconductor layer 22 is smaller than the interval Q.

When observed from the top in the thickness direction of the semiconductor layer 22, the transistor area D surrounds the diode area C (see FIG. 1 to FIG. 4). When the transistor 11 of the transistor area D is ON, the Schottky barrier diode 10 of the diode area C is OFF, thereby realizing heat dissipation of the semiconductor layer 22 by using the diode area C. When the transistor 11 is OFF, heat dissipation of the semiconductor layer 22 may be realized by using the transistor area D. The above manner may prevent the semiconductor device 1 from rising in temperature. In particular, the transistor area D is configured to surround the diode area C, so as to dissipate the heat of one area by another area, thereby effectively preventing a rise in temperature of the semiconductor device 1. A plurality of diode areas C is scattered and uniformly distributed at a necessary interval, thus further effectively preventing a rise of temperature in the semiconductor device 1 (see FIG. 1 and FIG. 2).

The above-described embodiments of the present invention are intended to be illustrative only. Numerous alternative embodiments may be devised by persons skilled in the art without departing from the scope of the following claims.

What is claimed is:

1. A semiconductor device, comprising:
    a semiconductor layer;
    a transistor area in the semiconductor layer and constituting a trench-type transistor;
    a diode area in the semiconductor layer and constituting a Schottky barrier diode; and
    a recessed portion recessed from a surface of the semiconductor layer in the diode area toward a back surface side;
    the trench-type transistor comprising:
        a plurality of first trenches, dug from a surface of the semiconductor layer in the transistor area;
        a gate insulating film on an inner surface of the plurality of first trenches;
        an insulating layer on the plurality of first trenches;
        a channel area on an area which is sandwiched by the plurality of first trenches in the semiconductor layer;
        a source area on the channel area;
        a second trench penetrating through the insulating layer and the source area and reaching the channel area; and
    wherein the semiconductor layer in the diode area is thinner than the semiconductor layer in the transistor area; and
    a depth of the second trench is substantially the same as a depth of the recessed portion.

2. The semiconductor device according to claim 1, wherein the semiconductor layer in the diode area is 1 μm or more thinner than the semiconductor layer in the transistor area.

3. The semiconductor device according to claim 1, wherein a thickness of the semiconductor layer in the diode area is 2.5 μm or more.

4. The semiconductor device according to claim 1, wherein a bottom of the plurality of first trenches and the surface of the semiconductor layer in the diode area are located at the same position in a thickness direction of the semiconductor layer.

5. The semiconductor device according to claim 1, wherein in a thickness direction of the semiconductor layer, as compared with the surface of the semiconductor layer in the diode area, a bottom of the plurality of first trenches is located at a position further away from the back surface of the semiconductor layer.

6. The semiconductor device according to claim 1, wherein in a thickness direction of the semiconductor layer, as compared with the surface of the semiconductor layer in the diode area, a bottom of the plurality of first trenches is located at a position closer to the back surface of the semiconductor layer.

7. The semiconductor device according to claim 1, wherein a depth of the plurality of first trenches is 1 μm or more.

8. The semiconductor device according to claim 1, wherein a polysilicon-containing gate electrode is embedded on an inner side of the gate insulating film in the plurality of first trenches.

9. The semiconductor device according to claim 1, wherein the second trench is for getting contact in the source area; and
    the surface of the semiconductor layer in the diode area is located at a position deeper than a bottom of the second trench.

10. The semiconductor device according to claim 1, wherein the plurality of first trenches and the second trench are alternately configured as shown in vertical view along a thickness direction of the semiconductor layer.

11. The semiconductor device according to claim 10, wherein the plurality of first trenches and the second trench are stripe-shaped.

12. The semiconductor device according to claim 10, wherein the plurality of first trenches are mesh-shaped as a mesh-shaped area on which the second trench is configured on an inner side thereof.

13. The semiconductor device according to claim 1, wherein the transistor area surrounds the diode area as shown in vertical view along a thickness direction of the semiconductor layer.

14. The semiconductor device according to claim 1, further comprising:
- a metal film, stacked on the insulating layer, electrically connected to the transistor and Schottky bonded with the semiconductor layer in the diode area; and
- a second metal film, covering a surface of the metal film and a wiring layer is stacked thereon.

15. The semiconductor device according to claim 14, wherein the metal film comprises Ti, Mo, Pd or TiN.

16. The semiconductor device according to claim 1, wherein the semiconductor layer is epitaxially grown on a surface of a semiconductor substrate.

17. The semiconductor device according to claim 16, further comprising:
- a back surface electrode, in ohmic contact with a back surface of the semiconductor substrate.

18. A semiconductor package, comprising:
the semiconductor device according to claim 1; and
a resin package, covering the semiconductor device.

* * * * *